United States Patent
Höppner et al.

(10) Patent No.: US 6,647,791 B1
(45) Date of Patent: Nov. 18, 2003

(54) DEVICE FOR CONTACTLESSLY GRIPPING AND POSITIONING COMPONENTS

(75) Inventors: Jürgen Höppner, Fahrenzhausen (DE); Josef Zimmerman, Regensburg (DE)

(73) Assignee: Technische Universitat Munchen, Munich (DE)

( * ) Notice: Subject to any disclaimer, the term of this patent is extended or adjusted under 35 U.S.C. 154(b) by 0 days.

(21) Appl. No.: 09/958,832

(22) PCT Filed: Apr. 13, 2000

(86) PCT No.: PCT/DE00/01152
§ 371 (c)(1),
(2), (4) Date: Feb. 22, 2002

(87) PCT Pub. No.: WO00/61474
PCT Pub. Date: Oct. 19, 2000

(30) Foreign Application Priority Data

Apr. 14, 1999 (DE) .......................................... 199 16 859

(51) Int. Cl.⁷ ................................................. B06B 3/00
(52) U.S. Cl. ....................................... 73/570.5; 181/0.5
(58) Field of Search ..................... 73/570.5; 181/0.5; 406/86; 414/676

(56) References Cited

U.S. PATENT DOCUMENTS

| | | | |
|---|---|---|---|
| 4,284,403 A | 8/1981 | Rey | ................. 432/1 |
| 5,036,944 A | 8/1991 | Danley et al. | ................. 181/0.5 |
| 5,080,549 A | 1/1992 | Goodwin | ................. 414/744.8 |

FOREIGN PATENT DOCUMENTS

| | | | | |
|---|---|---|---|---|
| DE | 199 16 872 | | 4/2000 | |
| EP | 0 064 593 A1 | * | 11/1982 | ............ B65H/5/22 |
| JP | 6-249640 | | 9/1964 | |

* cited by examiner

*Primary Examiner*—John E. Chapman
(74) *Attorney, Agent, or Firm*—Burns, Doane, Swecker & Mathis, LLP

(57) ABSTRACT

A mechanism for the contactless gripping and positioning of a component having a planar peripheral edge region, including a sound producing device producing a pattern of levitation sound waves for keeping the component in suspension at a selected position. The sound producing device is configured wherein only the peripheral edge region of the component lies in the sound wave pattern to be acted upon thereby and is fixed in the sound wave pattern by Bernoulli forces. The total surface area of the sound producing device is less than the component's total surface area facing the sound producing device.

4 Claims, 2 Drawing Sheets

DEVICE FOR CONTACTLESSLY GRIPPING AND POSITIONING COMPONENTS

BACKGROUND

The present invention relates to a device for contactless gripping, holding, and positioning of preferably contact-sensitive components.

In case of contact-sensitive components, e.g. wafers, particles axe removed at contact points during mechanical contact, which may negatively influence a technological working process depending on the pre-determined conditions of the edges.

To avoid particle degeneration or damage to the surface of a component, non-contact gripping devices have been developed that use overpressure and/or partial. vacuum of flowing gases to hold the component as described in Goodwin et al. U.S. Pat. No. 5,080,549. This type of gripper will be termed as pneumatic gripper in the following.

However, it is of significance during transporting of wafers in clean rooms that the technologically required airflow (laminar flow condition) is not negatively influenced in these clean rooms. The air flowing in or out of jets of the gripper disturbs the laminar flow condition in the clean room and increases thereby the risk of freely-traveling particles influencing the quality of manufacturing.

An additional disadvantage of blowing grippers is the high vorticity of the air discharging from the jets. Particles that axe stuck to the underside of the wafers, for example, may thereby freely travel and deposit themselves on the top surface of the wafer as well.

It is the object of the invention to provide a technology that avoids the disadvantages of the pneumatic gripper mentioned above.

SUMMARY OF INVENTION

The invention is a contactless gripping and holding device provided is for components whose gripping and holding forces axe produced according to the principle of acoustic standing wave levitation, The peculiarity of this gripping and holding device exists in the fact that only the edge sections of the components protrude into the acoustic field of force pattern and are held in place there by Bernoulli forces. Thus, then total area of the sound-radiating surfaces of the sound-producing means may be considerably smaller than the top surface area of the component being levitated, i.e., smaller than the component's total surface area facing the sound-producing means.

In contrast, the sound-radiating surfaces in the traditional acoustic standing wave levitation define a total surface area that is considerably larger than the top surface of the levitated item.

In one aspect of the invention, it is assumed that the edge sections of the component protruding into the acoustic field of force are designed in such a manner that they act as reflectors, which means that a reflector, which is always necessary in the traditional acoustic standing wave levitation, is no longer required.

It must be especially mentioned that not only completely flat items, as wafers for example, may be held. Only the edge surfaces or some sections of these edge surfaces must have the required reflection characteristics, which means, they must reflect the striking sound wave again in the direction of the source of sound. It must be mentioned as well that the edge surfaces acting as reflector may lie also within the component's surface should the component be provided with a boring or other openings, for example.

The device can be supplemented with separate reflectors, which increase the holding forces. This type of arrangement is provided when the edge sections of the item have rather poor reflection characteristics.

The spatial position and/or the geometric shape of the sound-producing means and of the reflectors are selected depending on the shape of the component being levitated. Only similar shaped components may therefore be held, which is, however, also often times a characteristic for traditional gripping and holding devices.

Additional sound sources could be employed in place of reflectors whereby the holding forces of the gripper may be additionally increased. Those skilled in the art know that the respective sound sources, which are emitting sound against each other, must be tuned to one another to adjust the energy nodal at one plane.

In conclusion, it must be mentioned that the gripping devices according to the present invention may be employed especially advantageously in technological processes in which the operational steps of horizontal and vertical transporting as well as storing or interim storing occur according to the principle of acoustic levitation or according to the principle of sound pressure in the vicinity of the source of sound. Such a system operates also reliably without gravitation.

BRIEF DESCRIPTION OF DRAWINGS

In the following, the invention is explained in more detail with the aid of an embodiment example in conjunction with schematic drawings.

FIG. 1 shows a first embodiment example whereby

DETAILED DESCRIPTION OF PREFERRED EMBODIMENTS

Figure 1B:
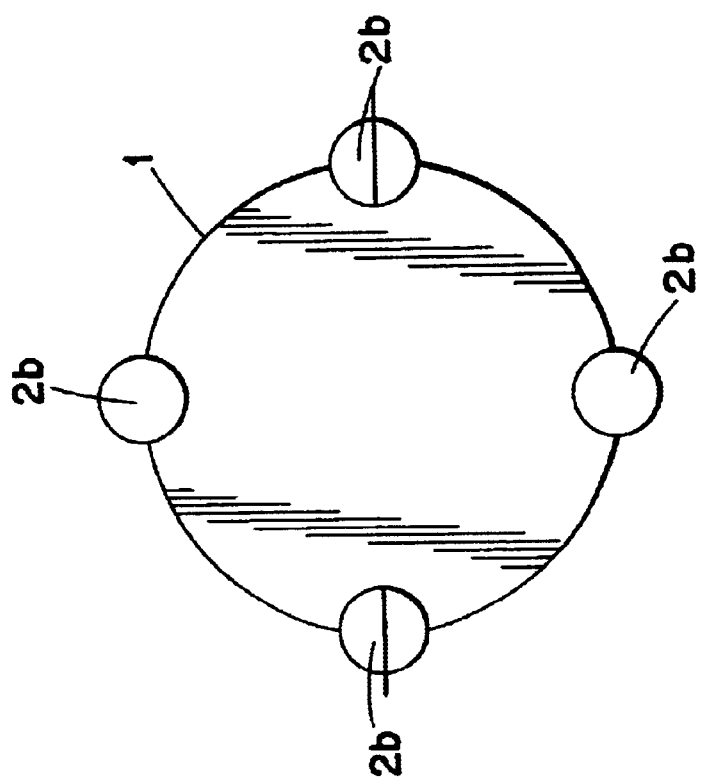
FIG. 1b shows a top view.
Figure 1A:
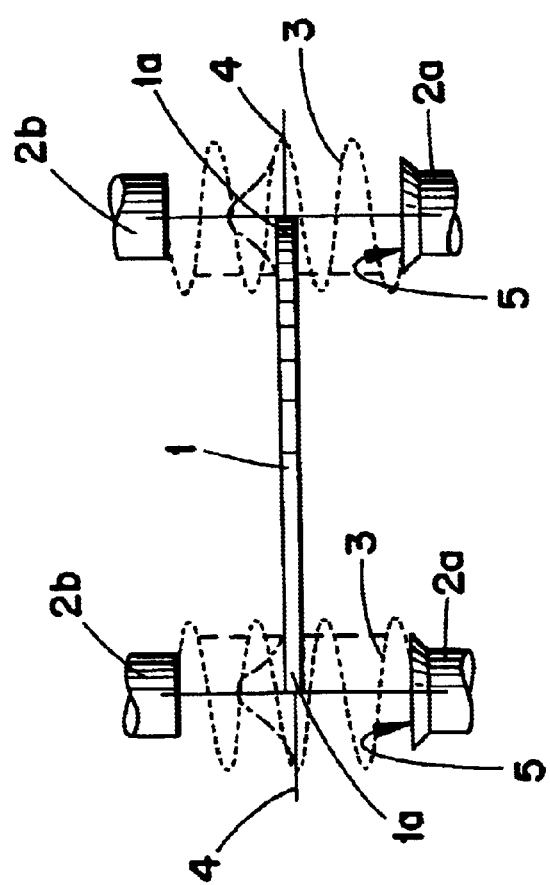
FIG. 1a shows a side view.

FIG. 1a and FIG. 1b show a device for holding a circular component 1. Four sound sources 2a are arranged in a staggered fashion at 900 around the edge section 1a of the component 1. Four reflectors 2b are arranged opposite the respective sound sources 2a. Sub-patterns of ultrasound waves 3 are emitted from the sound sources 2a, which travel in the direction of the respective reflectors 2b and which are then reflected thereby so that a standing waves are formed having a plurality of nodal points of energy. The component is held in the energy nodal 4 in the present example.

Figure 2:
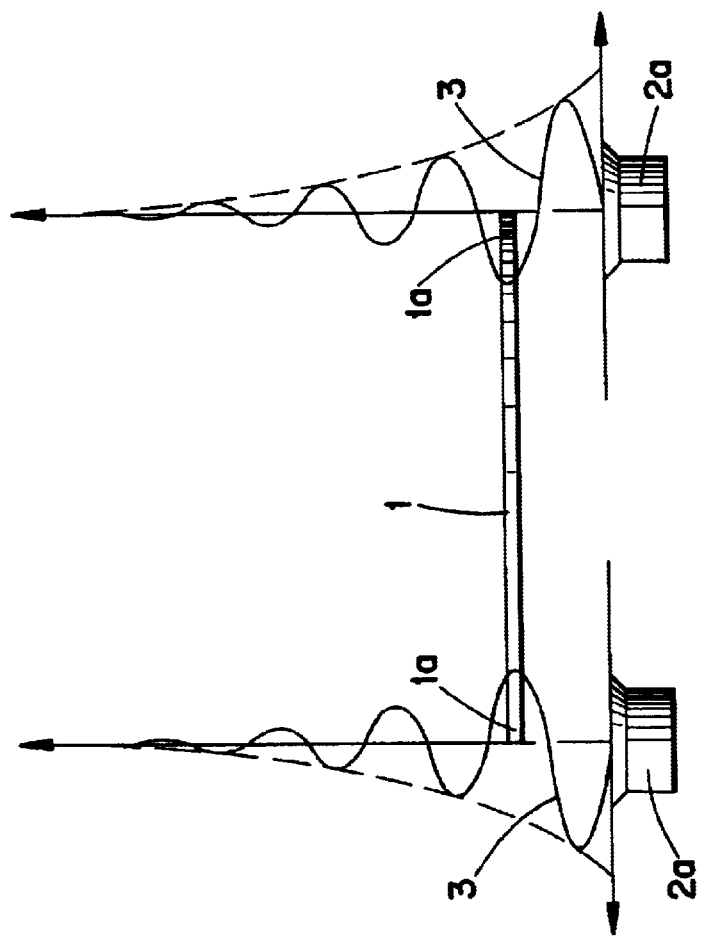
FIG. 2 shows a second embodiment in a side view.

FIG. 2 shows a second embodiment in a side view. In this embodiment, only the sound sources 2a are arranged at the edge section 1a of the component 1. Since reflectors are lacking, the sound intensity decreases greatly in the direction of the sound propagation so that the holding force is less than in an arrangement with reflectors. However, the reduction in holding force may be compensated by an increase in sound capacity. The advantage of this arrangement exists in the fact that components may be positioned with this gripper also at work stations at which the opposite location of reflectors would be a hindrance in the area.

Figure 3:
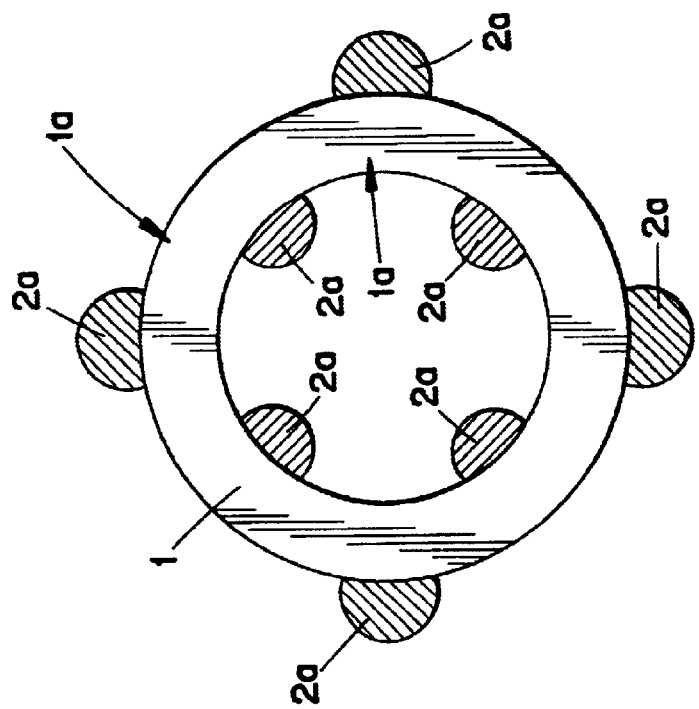
FIG. 3 shows a second embodiment in a top view.

FIG. 3 shows a configuration according to the second embodiment; however, this is for an annular component. The top view shows that the sound source 2a is arranged in such a manner that the outer edge section and the inner edge section of the component are surrounded by the sound sources.

These examples show that the arrangement of the sound sources and of the reflectors depend on the geometric shape of the component. Those skilled in the art may therefore choose a suitable arrangement using the knowledge of the imparted technical theory without having to perform an inventive activity.

What is claimed is:

1. Apparatus for the contactless gripping and positioning of a component having a planar peripheral edge region, the apparatus comprising a sound producing mechanism producing a pattern of levitation sound waves for keeping the component in suspension at a selected position, the sound producing mechanism configured wherein only the peripheral edge region of the component lies in the sound wave pattern to be acted upon thereby and is fixed in the sound wave pattern by Bernoulli forces; wherein a total surface area of the sound producing mechanism is less than the component's total surface area facing the sound producing mechanism.

2. The apparatus according to claim 1 wherein the sound producing mechanism configures a plurality of sound producing sources for producing respective sub patterns of sound waves which together define the sound wave pattern for levitating the component.

3. The apparatus according to claim 2 further including sound reflectors arranged opposite respective ones of the sound producing sources.

4. The apparatus according to claim 1 wherein the sound producing mechanism constitutes a first mechanism, the apparatus further including a second sound producing mechanism disposed opposite the first sound producing mechanism.

* * * * *